(12) United States Patent
Chen et al.

(10) Patent No.: US 8,476,101 B2
(45) Date of Patent: Jul. 2, 2013

(54) METHOD OF FABRICATING PATTERNED CZT AND CDTE DEVICES

(75) Inventors: Henry Chen, Victoria (CA); Pramodha Marthandam, Victoria (CA); Salah Awadalla, Victoria (CA); Pinghe Lu, Victoria (CA)

(73) Assignee: Redlen Technologies, Sidney (CA)

( * ) Notice: Subject to any disclaimer, the term of this patent is extended or adjusted under 35 U.S.C. 154(b) by 732 days.

(21) Appl. No.: 12/654,646

(22) Filed: Dec. 28, 2009

(65) Prior Publication Data

US 2011/0156198 A1 Jun. 30, 2011

(51) Int. Cl.
*H01L 21/00* (2006.01)

(52) U.S. Cl.
USPC .................. 438/73; 257/448; 257/E21.124

(58) Field of Classification Search
USPC ..................... 257/448, E31.124; 438/773
See application file for complete search history.

(56) References Cited

U.S. PATENT DOCUMENTS

| | | | |
|---|---|---|---|
| 4,144,090 A | 3/1979 | Franz | |
| 5,100,767 A | 3/1992 | Yanagawa et al. | |
| 5,368,882 A | 11/1994 | Tran et al. | |
| 5,677,539 A | 10/1997 | Apotovsky | |
| 5,847,398 A | 12/1998 | Shahar et al. | |
| 5,905,264 A | 5/1999 | Shahar et al. | |
| 5,933,706 A | 8/1999 | James et al. | |
| 6,034,373 A | 3/2000 | Shahar et al. | |
| 6,037,595 A | 3/2000 | Lingren | |
| 6,043,106 A | 3/2000 | Mescher et al. | |
| 6,046,068 A | 4/2000 | Orava et al. | |
| 6,069,360 A | 5/2000 | Lund | |
| 6,121,622 A | 9/2000 | Beyne et al. | |
| 6,175,120 B1 | 1/2001 | Macgregor | |
| 6,212,093 B1 | 4/2001 | Lindsey | |
| 6,215,123 B1 | 4/2001 | Orava et al. | |
| 6,285,029 B1 | 9/2001 | Shahar et al. | |
| 6,329,658 B1 | 12/2001 | Mestais et al. | |
| 6,333,504 B1 | 12/2001 | Lingren | |
| 6,362,484 B1 | 3/2002 | Beyne et al. | |
| 6,410,922 B1 | 6/2002 | Spartiotis et al. | |
| 6,465,860 B2 | 10/2002 | Shigenaka et al. | |
| 6,510,195 B1 | 1/2003 | Chappo et al. | |
| 6,524,966 B1 | 2/2003 | Wright et al. | |
| 6,657,200 B2 | 12/2003 | Nygard et al. | |
| 6,694,172 B1 | 2/2004 | Gagnon et al. | |

(Continued)

FOREIGN PATENT DOCUMENTS

EP 1 156 347 A1 11/2001

*Primary Examiner* — Calvin Lee
*Assistant Examiner* — Monica D Harrison
(74) *Attorney, Agent, or Firm* — The Marbury Law Group PLLC

(57) ABSTRACT

A method of making a semiconductor radiation detector includes the steps of providing a semiconductor substrate having front and rear major opposing surfaces, forming a solder mask layer over the rear major surface, patterning the solder mask layer into a plurality of pixel separation regions, and after the step of patterning the solder mask layer, forming anode pixels over the rear major surface. Each anode pixel is formed between adjacent pixel-separation regions and a cathode electrode is located over the front major surface of the substrate. The solder mask can be used as a permanent photoresist in developing patterned electrodes on CdZnTe/CdTe devices as well as a permanent reliability protection coating. The method is very robust and ensures long-term reliability, outstanding detector performance, and may be used in applications such as medical imaging and for demanding other highly spectroscopic applications.

16 Claims, 12 Drawing Sheets

U.S. PATENT DOCUMENTS

| | | |
|---|---|---|
| 6,765,213 B2 | 7/2004 | Shahar et al. |
| 6,781,132 B2 | 8/2004 | Macgregor |
| 7,038,288 B2 | 5/2006 | Lai et al. |
| 7,166,848 B2 | 1/2007 | El-Hanany et al. |
| 7,208,740 B2 | 4/2007 | El-Hanany et al. |
| 7,223,981 B1 | 5/2007 | Capote et al. |
| 7,223,982 B1 | 5/2007 | Chen et al. |
| 7,339,176 B2 | 3/2008 | El-Hanany et al. |
| 7,525,098 B2 | 4/2009 | El-Hanany et al. |
| 7,582,878 B2 | 9/2009 | Shahar et al. |
| 7,589,324 B2 * | 9/2009 | Chen et al. ............ 250/370.08 |
| 2001/0035497 A1 | 11/2001 | Montemont et al. |
| 2002/0066531 A1 | 6/2002 | Ke et al. |
| 2002/0158207 A1 | 10/2002 | Spartiotis et al. |
| 2002/0182716 A1 | 12/2002 | Weisbuch et al. |
| 2003/0173523 A1 | 9/2003 | Vuorela |
| 2004/0052456 A1 | 3/2004 | Boffi et al. |
| 2005/0167606 A1 | 8/2005 | Harrison et al. |
| 2005/0189474 A1 | 9/2005 | Tomioka |
| 2005/0230627 A1 | 10/2005 | Protic et al. |
| 2006/0255280 A1 | 11/2006 | Shibayama |
| 2007/0158574 A1 | 7/2007 | Petrillo et al. |
| 2007/0194243 A1 | 8/2007 | Chen et al. |
| 2008/0042070 A1 | 2/2008 | Levin |

* cited by examiner

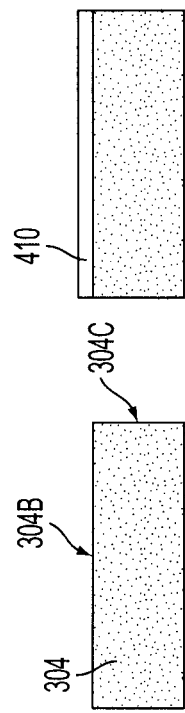
FIG. 1A
FIG. 1B
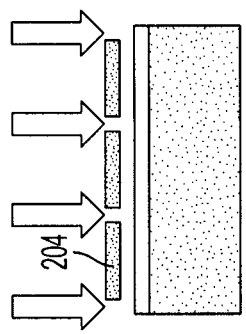
FIG. 1C
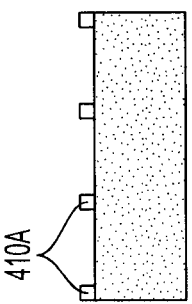
FIG. 1D
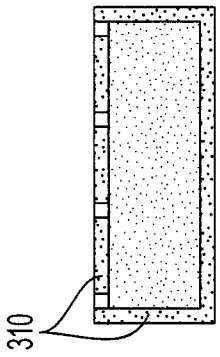
FIG. 1E
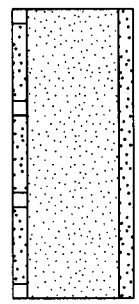
FIG. 1F
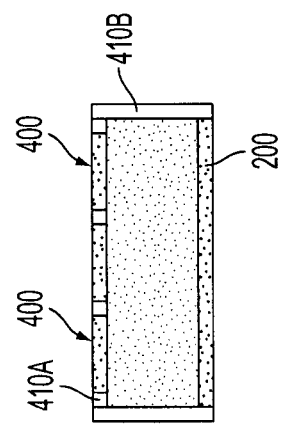
FIG. 1G

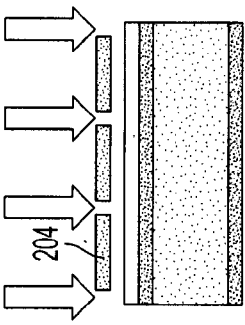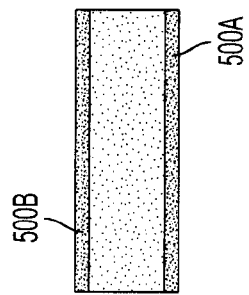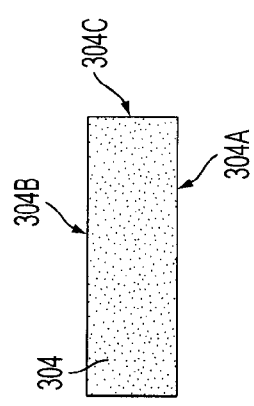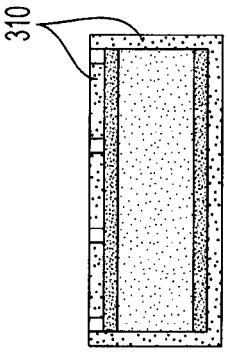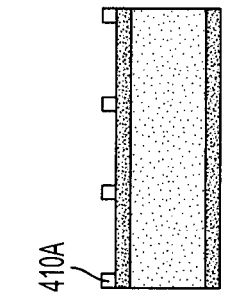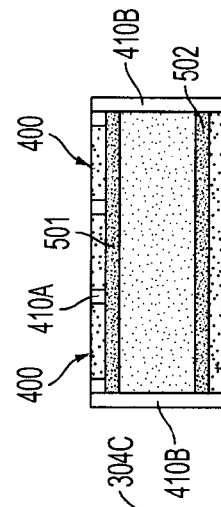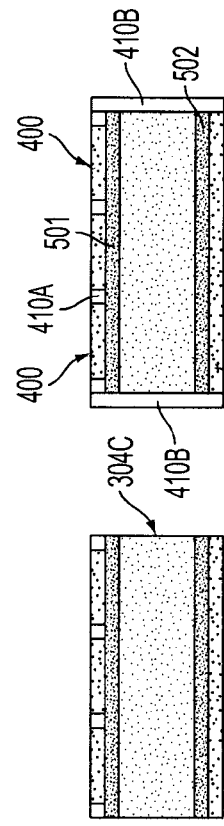

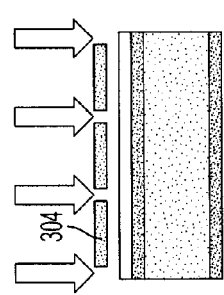
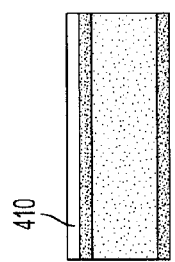
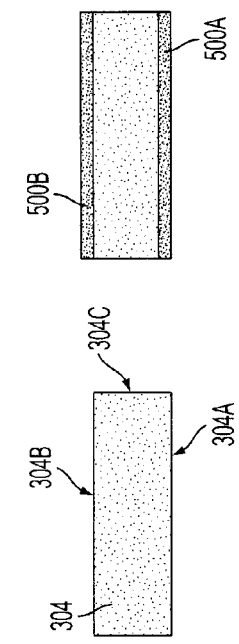
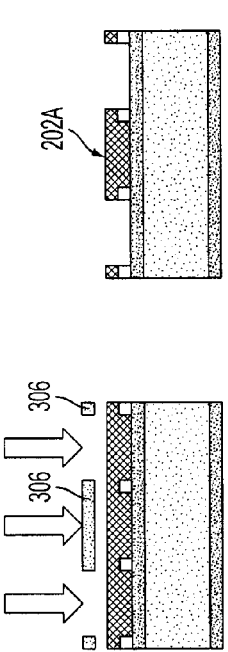
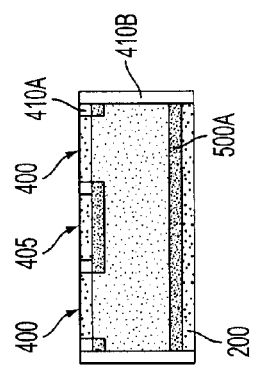
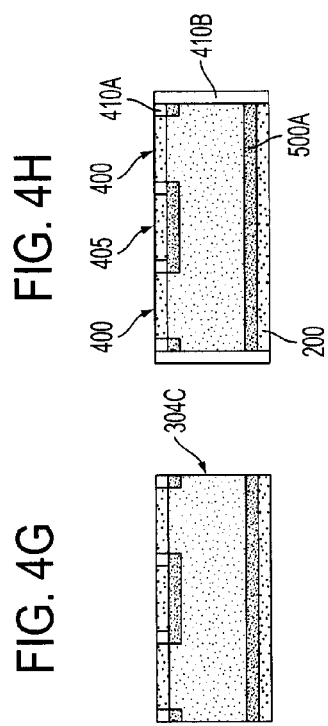
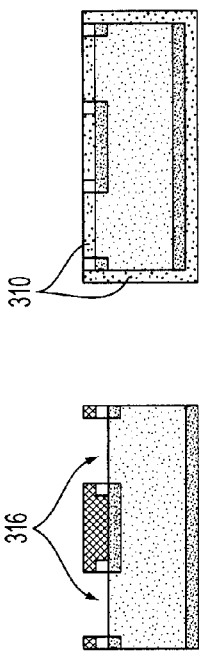

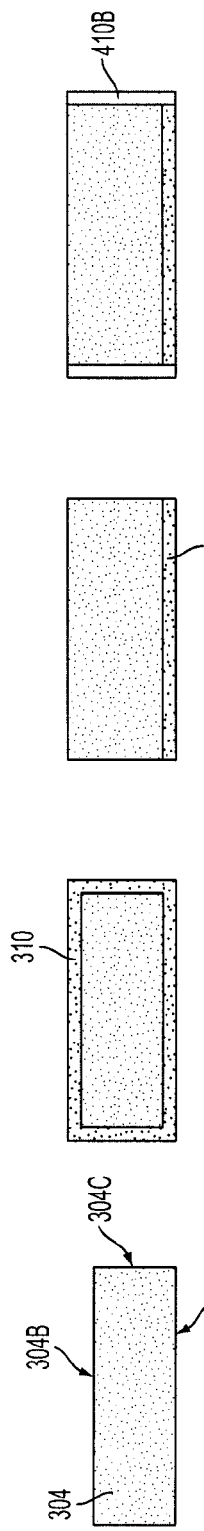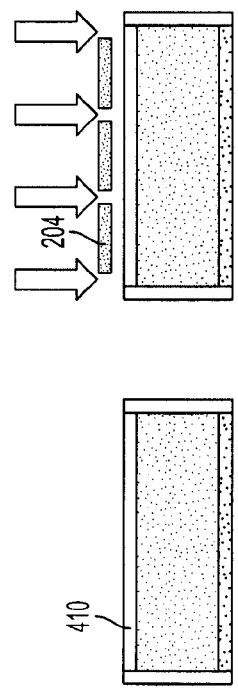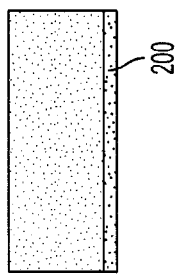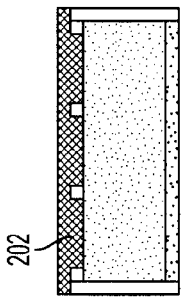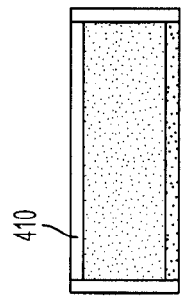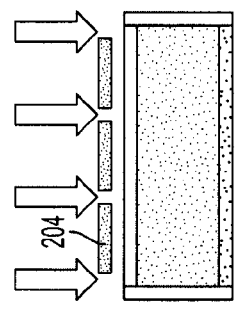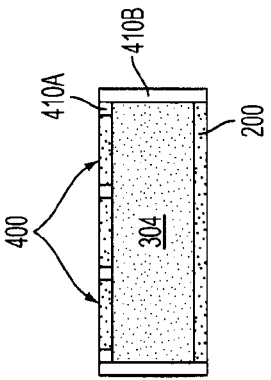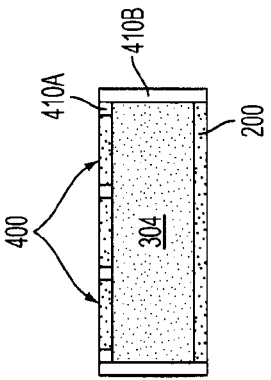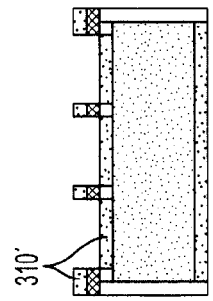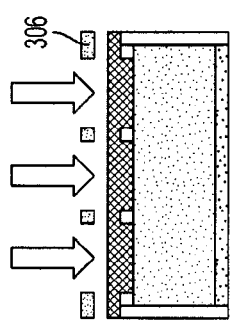

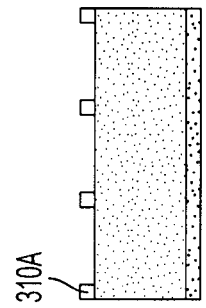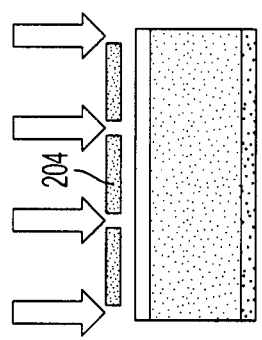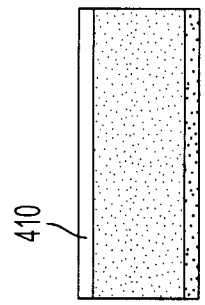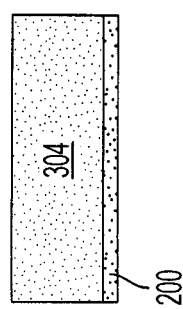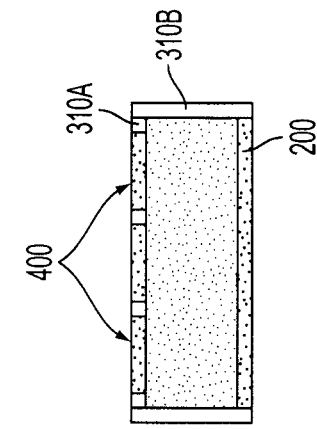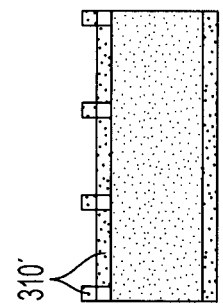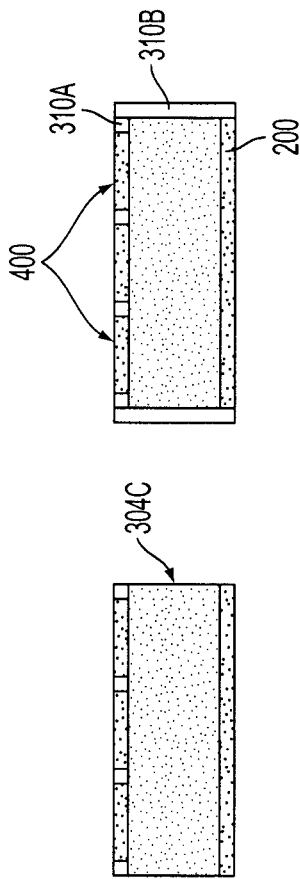

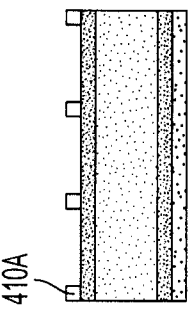
FIG. 8D
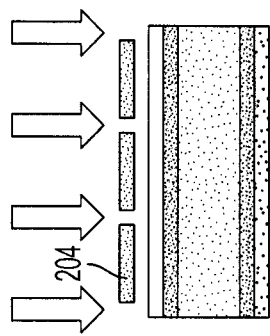
FIG. 8C
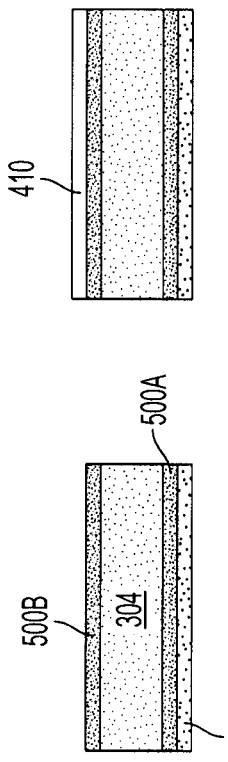
FIG. 8B
FIG. 8A
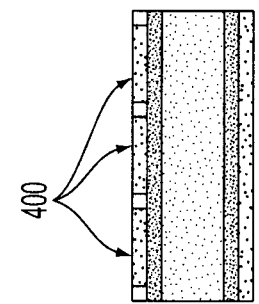
FIG. 8E
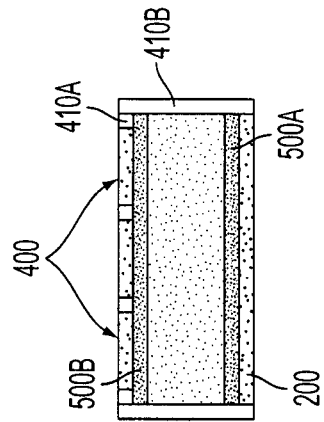
FIG. 8F

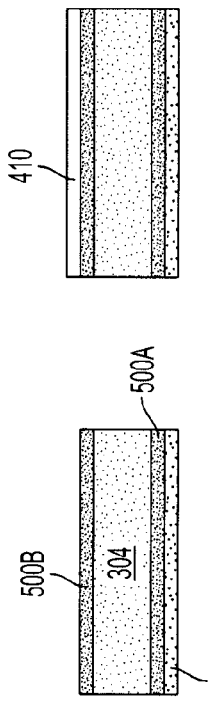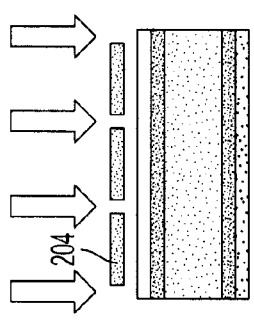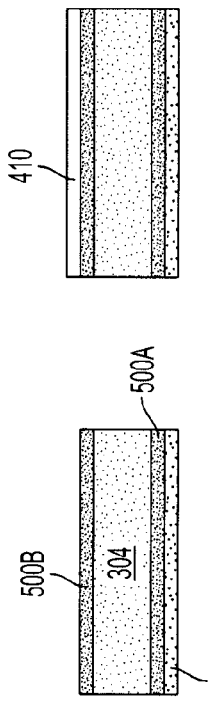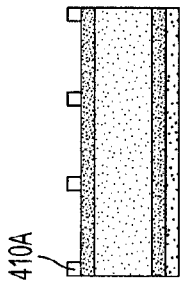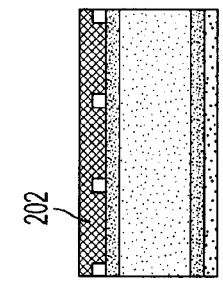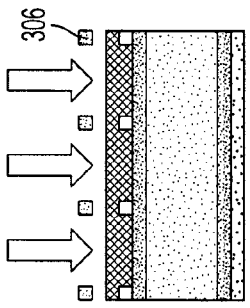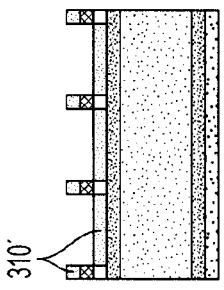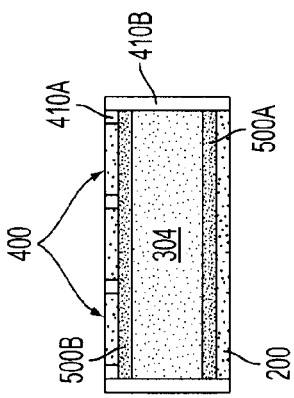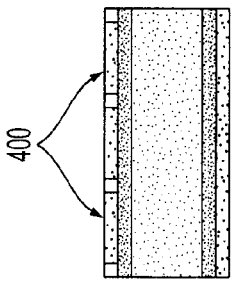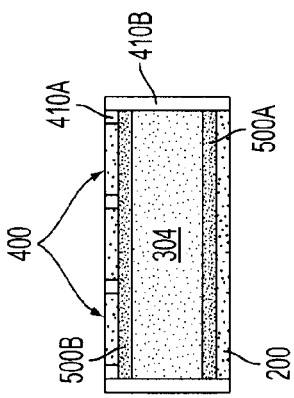

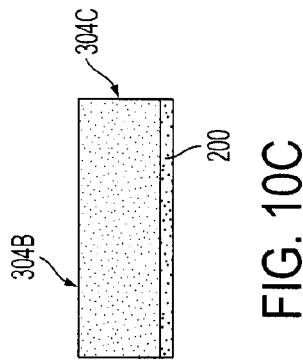
FIG. 10C
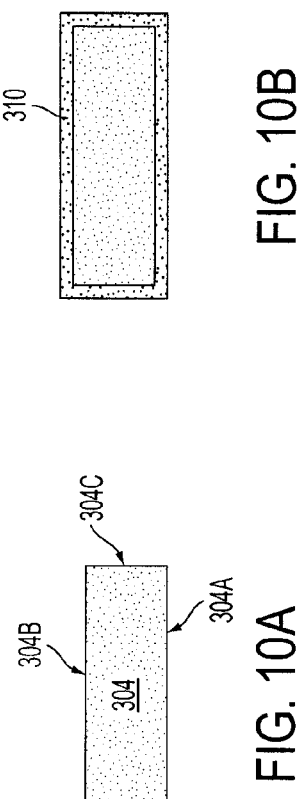
FIG. 10A / FIG. 10D / FIG. 10G
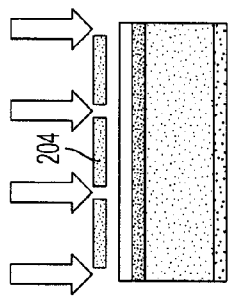
FIG. 10B
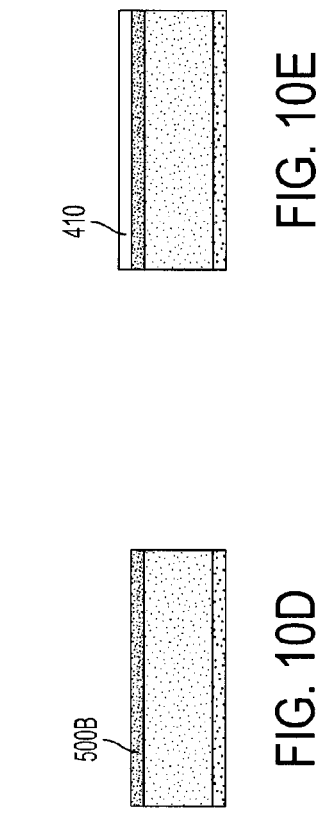
FIG. 10E / FIG. 10H
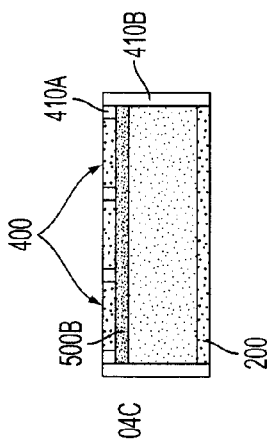
FIG. 10F
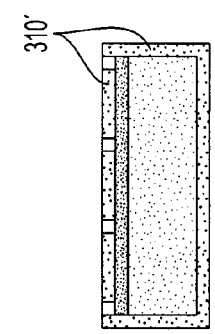
FIG. 10I
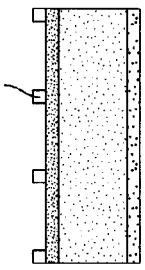
FIG. 10J

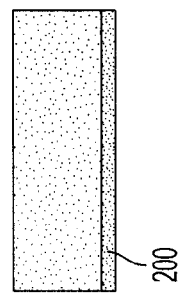
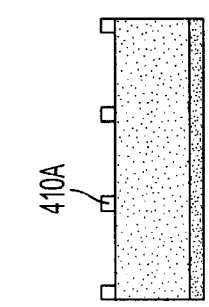
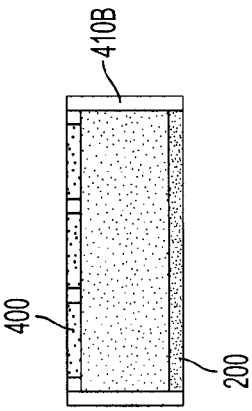
FIG. 11C
FIG. 11F
FIG. 11I
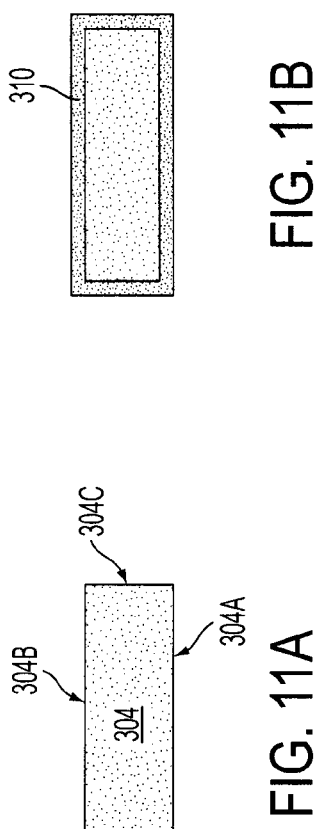
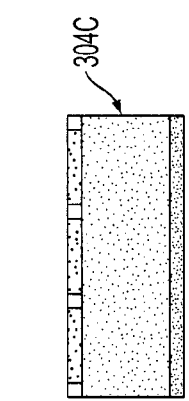
FIG. 11B
FIG. 11E
FIG. 11H
FIG. 11A
FIG. 11D
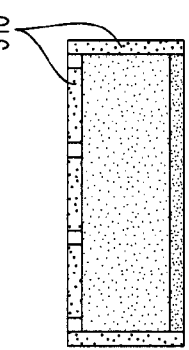
FIG. 11G

METHOD OF FABRICATING PATTERNED CZT AND CDTE DEVICES

BACKGROUND OF THE INVENTION

The present invention relates generally to the field of semiconductor devices and particularly to radiation detectors.

The general requirement for room temperature operation of a semiconducting material as a radiation detector and spectrometer (e.g., for a PET or CT scanner) is relatively large band gap energy such that thermal generation of charge carriers is kept to a minimum. Conversely, the requirement for high resolution is small band gap energy such that a large number of electron-hole pairs are created for an absorbed quantum of ionizing radiation. The material under consideration should also have a relatively high average atomic number if used in gamma ray spectroscopy to increase the gamma ray interaction probability. High charge carrier mobilities and long charge carrier lifetimes are also needed to ensure efficient charge carrier extraction and minimal effects from position-dependent charge collection. Detectors fabricated from Cadmium Zinc Telluride (CZT) meet these requirements and are used for gamma and X-ray detection. However, in addition to excellent bulk properties of the CZT single crystal, the fabrication process and structure to create electrodes on the detector is important for high performance of the detector device.

The metal/semiconductor contact (i.e., electrode to semiconductor tile) plays an important role in determining the performance of the CZT detector device. A good metal/semiconductor contact, especially for a segmented detector, must have good adhesion, and must be reliable for assembly processes, including low temperature soldering.

Heretofore these criteria have not been met in conventional CZT radiation detector technology. CdZnTe (CZT), and particularly $Cd_{(1-x)}Zn_xTe$ (where x is less than or equal to 0.5), is a wide band gap ternary II-VI compound semiconductor that, because of its unique electronic properties, is desirable for use in gamma-ray and X-ray spectrometers that operate at room temperature for nuclear radiation detection, spectroscopy and medical imaging applications. However, the performance of gamma-ray and x-ray segmented radiation detectors used in imaging applications and fabricated from CZT crystals is often limited because conventional fabrication processes do not provide the desired contact properties. Typically these devices have pixilated electrode arrays fabricated from various deposition and lithography processes with a gap between pixels, called the interpixel gap or region. Interpixel leakage currents act as a source of noise that reduces the ability of these spectrometers to resolve spectrally the unique radiological emissions from a wide variety of radioactive isotopes—i.e., results in a lower energy resolution (ER). The so-called interpixel resistance is a key limitation to performance and is typically much lower than overall device resistivity. Thus, in order to improve the spectral resolution capability of devices based on CZT crystals as well as on CdTe and other semiconductor materials it is desirable to decrease interpixel leakage currents and the attendant detrimental noise effects.

It is known that for a semiconductor crystal to function effectively as a good detector material (i.e., minimizing interpixel surface leakage currents, thereby maximizing energy resolution) the crystal surfaces in the interpixel gap should have resistivity equal or higher than that of the bulk crystal. Generally, the interpixel surface quality is a function of the device fabrication process and/or method used.

A small number of companies worldwide currently produce CZT detectors commercially in a variety of sizes and thicknesses. Usually one or both sides of the planar detectors are contacted with a continuous metal layer such as gold (Au) or platinum (Pt). As mentioned above, such detector substrates then need to be processed to produce a detector having a pattern of segmented contacts (e.g., pixel pads or electrode) on one surface, with the opposite surface remaining uniformly metallized. This is done so that the detector is able to produce a detector output indicating the position at which radiation impacts the detector.

It be believed that commercial pixilated or segmented CZT devices have been fabricated by the inverse lithography (or "lift off") method, with its inherent performance limitations. Also, poor adhesion of metal electrodes frequently causes very serious electrode lift-off problems leading to failure of the device and limited long-term reliability. Others have found that the surface resistivity of cadmium-based substrates is degraded when the substrate is exposed to conventional metal etchants and etching processes suitable for removing gold. As a result of this, the electrical separation of the individual contacts which results from the conventional method of forming contacts is not as good as would have been expected from the bulk properties before treatment. The inverse-lithography process can be used to reduce etching damage, but has not resulted in excellent interpixel resistivity combined with adequate gold adhesion of the contacts, due to limitations of the process. An example of the inverse-lithography process is U.S. Pat. No. 6,410,922, which requires additional passivation layers to facilitate the lift-off of the interpixel gap and the electrodes to overlap the passivation material. The poor contact adhesion provided by this method makes conventional attachment by methods, such as low temperature soldering difficult.

SUMMARY OF THE EMBODIMENTS

In one embodiment, a method of making a semiconductor radiation detector comprises providing a semiconductor substrate comprising front and rear major opposing surfaces, forming a solder mask layer over the rear major surface, and patterning the solder mask layer into a plurality of pixel separation regions. After the step of patterning the solder mask layer, the method further comprises forming anode pixels over the rear major surface. Additionally, in this embodiment, each anode pixel is formed between adjacent pixel-separation regions and a cathode electrode is located over the front major surface of the substrate.

In another embodiment, a radiation detector comprises a semiconductor substrate having opposing front and rear surfaces, a cathode electrode located over the front surface of said semiconductor substrate, a solder mask formed as a plurality of pixel separation regions and a plurality of anode pixels located over the rear surface of said semiconductor substrate. In the radiation detector, adjacent anode pixels are separated by a respective pixel separation region and the solder mask of the pixel separation regions does not extend over the anode pixels. Additionally, the solder mask remains on the device after the device is connected to an external circuit.

BRIEF DESCRIPTION OF THE DRAWINGS

FIGS. 1A-1G are schematic side cross-sectional views of a method of making a detector at various stages of formation according to one embodiment.

FIGS. 2A-2H are schematic side cross-sectional views of a method of making a detector at various stages of formation according to another embodiment.

FIGS. 4A-4L are schematic side cross-sectional views of a method of making a detector at various stages of formation according to another embodiment.

FIGS. 5A-5K are schematic side cross-sectional views of a method of making a detector at various stages of formation according to another embodiment.

FIGS. 6A-6G are schematic side cross-sectional views of a method of making a detector at various stages of formation according to another embodiment.

FIGS. 8A-8F are schematic side cross-sectional views of a method of making a detector at various stages of formation according to another embodiment.

FIGS. 9A-9I are schematic side cross-sectional views of a method of making a detector at various stages of formation according to another embodiment.

FIGS. 10A-10J are schematic side cross-sectional views of a method of making a detector at various stages of formation according to another embodiment.

FIGS. 11A-11I are schematic side cross-sectional views of a method of making a detector at various stages of formation according to another embodiment.

DETAILED DESCRIPTION OF THE EMBODIMENTS

Figure 3D:
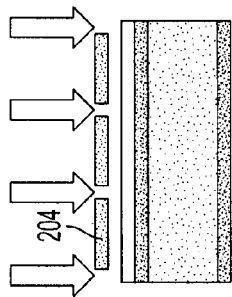
FIGS. 3A-3I are schematic side cross-sectional views of a method of making a detector at various stages of formation according to another embodiment.

Radiation detectors can be configured in a variety of ways. A common configuration includes a cathode electrode and a plurality of anode electrodes located on opposite sides of a semiconductor plate or substrate. Typically these monolithic multichannel radiation detectors have pixilated anode electrode arrays fabricated on a common semiconductor substrate by various deposition and lithography processes resulting in a gap between pixels, termed the interpixel gap, interpixel region, or pixel separation region. Each anode electrode pixel forms one of the plurality of detector channels.

In the preferred embodiments, the radiation detectors comprise a semiconductor material, such as a semiconductor material preferably comprising cadmium zinc telluride (CdZnTe or CZT) or CdTe. Although other types of semiconductor materials exemplified by lead iodide, thallium bromide, gallium arsenide or silicon may be used.

More preferred is $Cd_{(1-x)}Zn_xTe$ (where x is less than or equal to 0.5), a wide band gap ternary II-VI compound semiconductor with unique electronic properties. This type of semiconductor is useful in gamma-ray and X-ray detectors which are used as spectrometers that operate at room temperature for radiation detection, spectroscopy and medical imaging applications.

Embodiments of the present invention allow fabrication of detectors with smaller pixel size, pitch and gap than conventional detectors. Additionally, the embodiments are very robust, provide advantageous improvements in performance and yield, and ensure long-term reliability and outstanding performance of pixilated detectors used in applications such as medical imaging and for demanding or other highly spectroscopic applications.

Generally, embodiments of the present invention provide a permanent radiation sensitive material (which can be referred to as a photoresist), such as a radiation sensitive (e.g., photoimageable) solder mask material, helpful in creating electrode patterns in photolithography fabrication of CdZnTe or CdTe devices. The solder mask can be used as a permanent photoresist in developing patterned electrodes on CdZnTe/CdTe devices as well as a permanent reliability protection coating.

The following definitions are used herein:

Cathode electrode: the electrode on one major surface of the detector substrate where incident gamma rays or x-rays enter the detector, i.e. positioned towards the radiation source.

Anode electrodes: segmented electrode contacts located on the rear surface of the substrate, i.e., positioned away from the radiation source.

Interpixel, or inter pixel: the region or gap separating pixel electrodes. For electrode configurations with non-pixellated discrete contact segments the term is equivalently applied to the gap between contact segments.

Passivation or chemical passivation: A treatment by which the stoichiometry of semiconductor substrate surface is restored. A passivation "layer" is a semiconductor layer or region of the semiconductor substrate, and is not an insulating layer.

Guard ring: A pattern of conductive material formed toward an outer perimeter of a detector tile to improve peripheral pixel performance and to compensate for degraded performance of edge pixels. The guard ring may be electrically connected to a steering grid.

Steering grid: A pattern of conductive material formed in the interpixel region(s) of a detector between anode pixels for improving the energy resolution of the detector by enhancing the small pixel effect, and for increasing detection by steering electrons to the anode pixels which otherwise would drive to the interpixel region. The steering grid may be electrically connected to the guard ring.

FIG. 12

Figure 12:
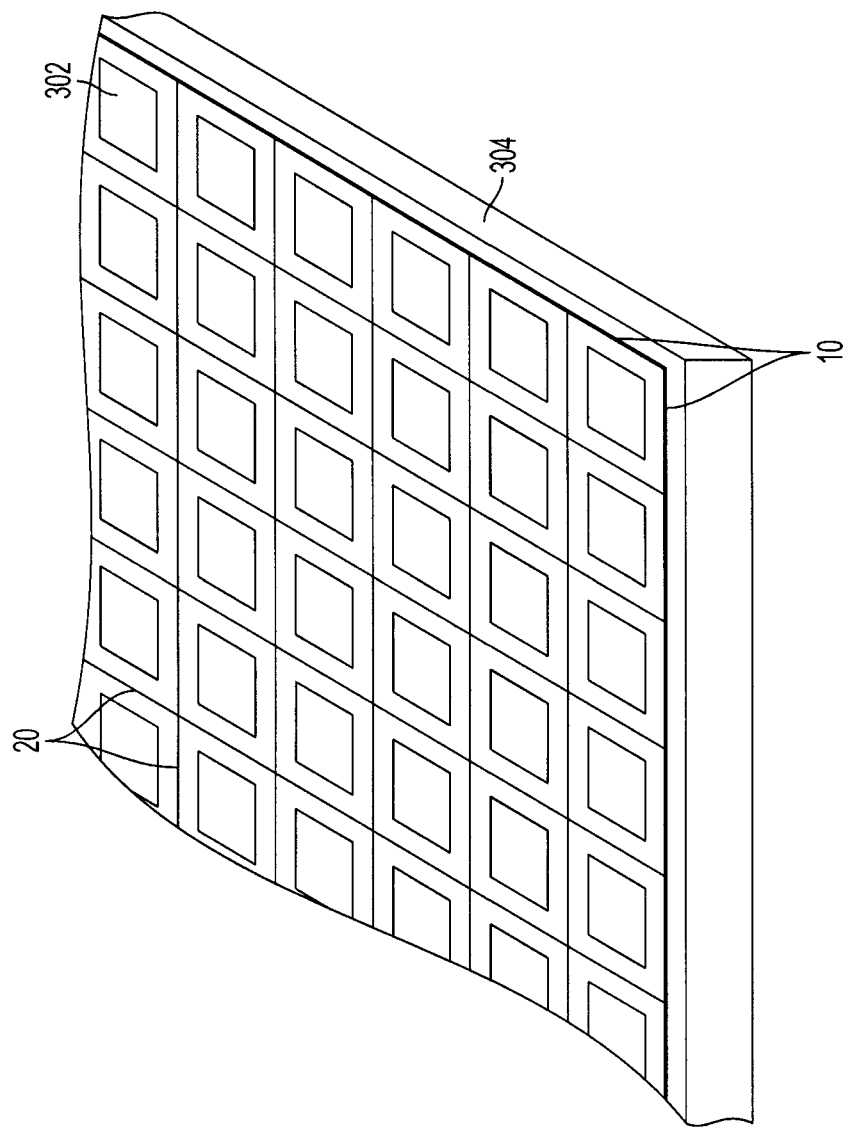
FIG. 12 is a perspective view of a CZT substrate with anode electrode pixels.

Illustrated in FIG. 12, is an example of pixellated anode electrodes 302 formed on a semiconductor substrate 304, such as a CZT substrate (also referred to as a "tile"). The cathode electrode (not shown) is formed on the bottom side of the substrate 304. The optional guard ring 10 is formed over a surface of the semiconductor substrate and toward an outer perimeter of the tile. The optional steering grid 20 is also formed over the substrate at interpixel regions (i.e. between the anode pixels). As shown in FIGS. 3I and 4L below, the optional guard ring and/or steering grid are shown schematically and are denoted by a single number 405. The anode electrodes 302 of FIG. 12 are referred to as anode pixels 400 in FIGS. 1-11 below.

Embodiments of the present invention provide methods of making a semiconductor radiation detector comprising the steps of: providing a semiconductor substrate comprising front and rear major opposing surfaces, forming a solder mask layer over the rear major surface, patterning the solder mask layer into a plurality of pixel separation regions. After the step of patterning the solder mask layer, the method further comprises forming anode pixels over the rear major surface. Additionally, in this embodiment, each anode pixel is formed between adjacent pixel-separation regions and a cathode electrode is located over the front major surface of the substrate.

In some optional embodiments, solder mask material is also formed on side walls of the substrate after the step of forming the anode pixels.

In some embodiments, at least the rear major surface of the semiconductor substrate is passivated prior to forming the solder mask layer. The passivated portions of the rear surface of the substrate between solder mask pixel separation regions may be etched prior to the step of forming the anode pixels. The anode pixels may be then formed directly on exposed unpassivated portions of the rear major surface.

In some other embodiments, the solder mask layer and anode pixels are formed directly on the rear major surface of the semiconductor substrate and the passivation step is omitted.

In yet some other embodiments, both the front and rear major surfaces of the semiconductor substrate are passivated prior to forming the solder mask layer and the anode and/or cathode electrodes are formed on the passivated substrate surface.

In some embodiments the substrate is provided with passivated front and rear major opposing surfaces, and the cathode electrode is formed on the front passivated surface.

In some embodiments, the step of patterning the solder mask layer into a plurality of pixel separation regions comprises exposing the solder mask layer to radiation through a mask and removing unexposed regions of the solder mask layer.

In some embodiments, the anode pixels and cathode electrode are formed over the substrate in a single step.

In some other embodiments the anode pixels and cathode electrode are formed over the substrate in different steps.

In some embodiments, the anode pixels do not extend over the solder mask pixel separation regions. In other embodiments, they do.

In some embodiments, the anode pixels and cathode electrode are formed by electroless plating during the same step.

In some other embodiments, the anode pixels are formed by sputtering.

In some embodiments, the substrate is a polished or an etched CZT or CdTe tile.

In some embodiments, the semiconductor substrate is provided with the cathode electrode formed on the front major surface prior to the step of forming the solder mask layer.

In yet some other embodiments, the anode pixels comprise at least one selected from the group consisting of Pt, Pd, In, Ni, Al, and Au.

In some other embodiments, the cathode comprises at least one selected from the group consisting of indium and gold.

In some embodiments, the anode pixels and cathode electrode comprise gold.

In some other embodiments, the anode pixels comprise gold and the cathode electrode comprises indium.

In some embodiments, the method further comprises forming the solder mask between the substrate and at least one of a guard ring and steering grid, forming solder mask over at least one of the guard ring and steering grid, or forming solder mask between the substrate and at least one of the guard ring and steering grid and over at least one of the guard ring and steering grid.

In some embodiments, the method further comprises forming solder mask over a portion of each of the anode pixels.

In some embodiments, a top surface of each of the anode pixels is coplanar with a top surface of the solder mask formed as a plurality of pixel separation regions.

Features of embodiments of the invention discussed above, and additional features which will be apparent to one of ordinary skill in the art, may be combined to form new embodiments. For example, the embodiments shown in FIGS. 1A-11I, as described below, represent specific combinations of the aforementioned embodiments and may include additional features not yet recited. Any step or feature in any one FIG. 1A-11I may be used in combination with any other one or more steps or features in these Figures.

FIGS. 1A-1G (IM1—Claim 21)

FIGS. 1A-1G are schematic cross-sectional views of a method of making a detector at various stages of formation according to one embodiment. In FIG. 1A, a semiconductor substrate 304 comprising front 304A and rear 304B major opposing surfaces is provided. At FIG. 1B, a solder mask layer 410 is formed over the rear major surface 304B. The solder mask layer 410 is patterned into a plurality of pixel separation regions 410A as shown in FIGS. 1C-1D. After the step of patterning the solder mask layer 410, the method further comprises forming anode pixels 400 over the rear major surface as shown in FIGS. 1E-1F. Additionally, in this embodiment, each anode pixel 400 is formed between adjacent pixel separation regions 410A. A cathode electrode 200 is located over the front major surface 304A of the substrate 304, as shown in FIG. 1G.

The step of patterning the negative radiation sensitive solder mask into a plurality of pixel separation regions can comprise exposing the solder mask layer 410 to radiation, for example, UV radiation, through a mask 204 as shown in FIG. 1C. Subsequently, unexposed regions of the solder mask layer 410 can be removed as shown in FIG. 1D. In other embodiments using a positive type of solder mask material, the exposed portions are removed and the unexposed portions are left in place.

Additionally, the steps of forming a plurality of anode pixels and cathode electrode may comprise the steps illustrated in FIGS. 1E-1G. For example, in FIG. 1E, a gold layer 310 may be formed on exposed portions of the rear major surface 304B between the solder mask pixel separation regions 410A, on the front major surface 304A and on sidewalls 304C of the semiconductor substrate. Other electrode materials may be used instead of gold. In one embodiment, the gold layer 310 is formed by electroless plating, for example. As shown in FIG. 1F, the gold layer can be removed from sidewalls 304, for example by polishing, such that a first portion of the gold layer located between the solder mask pixel separation regions 410A on the rear major surface 304B of the substrate forms the anode pixels 400, a second portion of the gold layer 310 located on the front major surface 304A of the semiconductor substrate 304 forms the cathode electrode 200, and no gold remains on the sidewalls 304C of the semiconductor substrate. Additional solder mask material 410B may be formed on the sidewalls 304C of the substrate 304 after the steps of forming the anode pixels 400 and cathode electrode 200 as shown in FIG. 1G. Thus, in this embodiment, the anode and cathode electrodes are formed in the same step. The anode pixels do not extend over regions 410 (i.e., there is no anode material 310 over tops of regions 410A).

FIGS. 2A-2H (IM2—Claim 22)

FIGS. 2A-2H are schematic cross-sectional views of a method of making a detector at various stages of formation according to another embodiment. In FIG. 2A, a semiconductor substrate 304 comprising front 304A and rear 304B major opposing surfaces is provided. At FIG. 2C, a solder mask layer 410 is formed over the rear major surface 304B. The solder mask layer 410 is then patterned into a plurality of pixel separation regions 410A as shown in FIGS. 2D-2E. After the step of patterning the solder mask layer 410, the method further comprises forming anode pixels 400 over the rear major surface as shown in FIGS. 2F-2G. Additionally, in this embodiment, each anode pixel 400 is formed between adjacent pixel separation regions 410A. A cathode electrode 200 is located over the front major surface 304A of the substrate 304 as shown in FIG. 2H.

The step of patterning the solder mask into a plurality of pixel separation regions can comprise exposing the solder mask layer 410 to radiation, for example, UV radiation, through a mask 204 as shown in FIG. 2D. Subsequently, unexposed regions of the solder mask layer 410 can be removed as shown in FIG. 2E.

In this embodiment, first 500A and second 500B passivating layers can be formed on the front 304A and rear 304B major surfaces, respectively, of the semiconductor substrate 304 as shown in FIG. 2B prior to forming the solder mask layer 410 in FIG. 2C. The solder mask is formed on the second passivating layer 500B.

Additionally, the steps of forming a plurality of anode pixels 400 and cathode electrode 200 may comprise the steps illustrated in FIGS. 2F-2H. For example, in FIG. 2F, a gold layer 310 (or another suitable electrode material) can be formed on exposed portions of the second passivating layer 500B on the rear major surface 304B between the solder mask pixel separation regions 410A, on the first passivating layer 500A on the front major surface 304A, and on sidewalls 304C of the semiconductor substrate 304 by, for example, an electroless plating process. The gold layer can be formed such that a first portion of the gold layer located between the solder mask pixel separation regions 410A on the second passivating layer 500B on the rear major surface 304B of the substrate 304 forms the anode pixels 400. The gold layer is also formed such that a second portion of the gold layer located on the first passivating layer 500A on the front major surface 304A of the semiconductor substrate 304 forms the cathode electrode 200, and no gold remains on the sidewalls 304C of the semiconductor substrate, as shown in FIG. 2G. Optionally, after the gold layer 310 is formed on the substrate as described above, a final polishing step may be utilized to remove the gold from the sidewalls of the semiconductor. Subsequently, optional additional solder mask material 410B can be formed on the sidewalls 304C of the substrate 304 after the steps of forming the anode pixels 400 and cathode electrode 200, as shown in FIG. 2H.

FIGS. 3A-3I (IM2A—Claim 23)

Figure 3C:
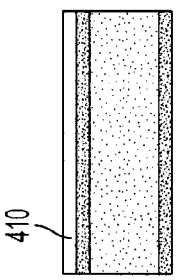
Figure 3B:
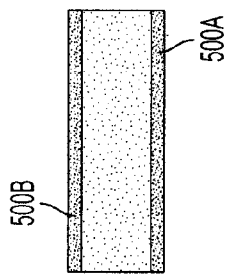
Figure 3A:
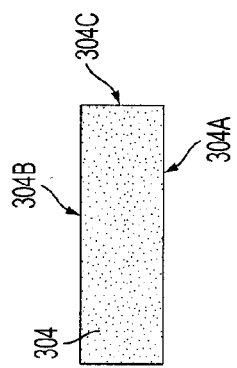
Figure 3G:
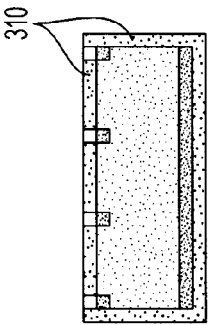
Figure 3F:
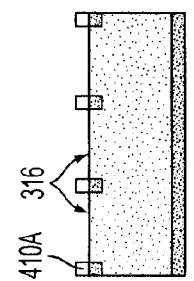
Figure 3E:
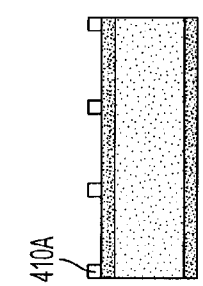
Figure 3I:
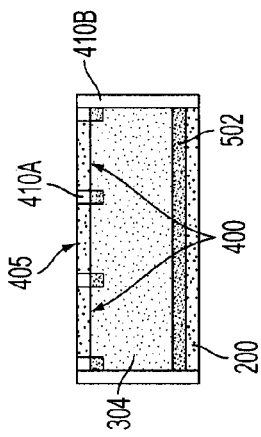
Figure 3H:
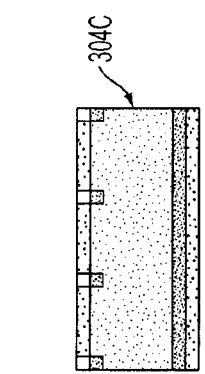

FIGS. 3A-3I are schematic cross-sectional views of a method of making a detector at various stages of formation according to another embodiment. In FIG. 3A, a semiconductor substrate 304 comprising front 304A and rear 304B major opposing surfaces is provided. At FIG. 3C, a solder mask layer 410 is formed over the rear major surface 304B. The solder mask layer 410 is then patterned into a plurality of pixel separation regions 410A as shown in FIGS. 3D-3E. After the step of patterning the solder mask layer 410, the method further comprises forming anode pixels 400 over the rear major surface as shown in FIGS. 3G-3I. Additionally, in this embodiment, each anode pixel 400 is formed between adjacent pixel separation regions 410A. A cathode electrode 200 is located over the front major surface 304A of the substrate 304 as shown in FIG. 3I.

The step of patterning the solder mask into a plurality of pixel separation regions can comprise exposing the solder mask layer 410 to radiation, for example, UV radiation, through a mask 204 as shown in FIG. 3D. Subsequently, unexposed regions of the solder mask layer 410 can be removed as shown in FIG. 3E.

In this embodiment, first 500A and second 500B passivating layers can be formed on the front 304A and rear 304B major surfaces, respectively, of the semiconductor substrate 304, as shown in FIG. 3B, prior to forming the solder mask layer 410 in FIG. 3C.

Additionally, exposed portions of the second passivating layer 500B located between the solder mask pixel separation regions 410A can be etched to expose unpassivated portions 316 of the rear major surface 304B of the substrate 304 as shown in FIG. 3F. The etching may be a wet etch with HCl).

The steps of forming a plurality of anode pixels 400 and cathode electrode 200 may comprise the steps illustrated in FIGS. 3G-3I. For example, as shown in FIG. 3G, a gold layer (or another suitable electrode material) 310 may be formed on the exposed portions 316 of the rear major surface 304B between the solder mask pixel separation regions 410A, over the first passivating layer 500A on the front major surface, and on sidewalls 304C of the semiconductor substrate 304 by, for example, an electroless plating process. The gold layer may also formed such that a first portion of the gold layer located between the solder mask pixel separation regions 410A on the exposed portions 316 of the rear major surface 304B of the substrate forms the anode pixels 400 and/or a guard ring and/or steering grid 405, a second portion of the gold layer located over the first passivating layer 500A on the front major surface 304A of the semiconductor substrate 304 forms the cathode electrode 200, and no gold remains on the sidewalls 304C of the semiconductor substrate 304. For example, after gold layer 310 is formed on the substrate as described above, a final polishing step may be utilized to remove the gold from the sidewalls of the semiconductor substrate.

Subsequently, optional additional solder mask material 410B can be formed on the sidewalls 304C of the substrate 304 after the steps of forming the anode pixels 400 and cathode electrode 200 as shown in FIG. 3I.

FIGS. 4A-4L (IM2B—Claim 24)

FIGS. 4A-4L are schematic cross-sectional views of a method of making a detector at various stages of formation according to another embodiment. In FIG. 4A, a semiconductor substrate 304 comprising front 304A and rear 304B major opposing surfaces is provided. At FIG. 4C, a solder mask layer 410 is formed over the rear major surface 304B. The solder mask layer 410 is then patterned into a plurality of pixel separation regions 410A as shown in FIGS. 4D-4E. After the step of patterning the solder mask layer 410, the method further comprises forming anode pixels 400 over the rear major surface as shown in FIGS. 4J-4L. Additionally, in this embodiment, each anode pixel 400 is formed between adjacent pixel separation regions 410A. A cathode electrode 200 is located over the front major surface 304A of the substrate 304 as shown in FIG. 4L.

The step of patterning the solder mask into a plurality of pixel separation regions can comprise exposing the solder mask layer 410 to radiation, for example, UV radiation, through a mask 204 as shown in FIG. 4D. Subsequently, unexposed regions of the solder mask layer 410 can be removed as shown in FIG. 4E.

In this embodiment, first 500A and second 500B passivating layers can be formed on the front 304A and rear 304B major surfaces, respectively, of the semiconductor substrate 304, as shown in FIG. 4B, prior to forming the solder mask layer 410 in FIG. 4C.

Also in this embodiment, a positive photoresist layer 202 can be formed over the solder mask pixel separation regions 410A and over exposed portions of the second passivating layer, as illustrated in FIG. 4F. Alternatively, a negative resist may be used instead. Subsequently, as shown in FIGS. 4G-4H, the positive photoresist may be patterned to expose the second passivating layer 500B and solder mask pixel separation regions 410A such that grid and guard ring regions are covered by patterned positive photoresist. Resist layer 202 may be exposed to radiation, such as UV radiation through mask 306 followed by removing exposed portions of the resist to patter the resist.

As shown in FIG. 4I, portions of the second passivating layer located between the solder mask pixel separation regions which are either not covered by the patterned positive photoresist, or may become exposed upon patterning of the positive photoresist, may be etched to expose unpassivated portions 316 of the rear major surface of the substrate. After this etching step, the remaining patterned positive photoresist may be removed.

The steps of forming a plurality of anode pixels 400 and cathode electrode 200 may comprise the steps illustrated in FIGS. 4J-4L. For example, as shown in FIG. 4J, a gold layer 310 may be formed on the rear major surface 304B of the semiconductor substrate 304 between the solder mask pixel separation regions 410, on a portion of the second passivating layer in the grid and guard ring region that was previously covered by the patterned positive photoresist (as in FIG. 4I), on the first passivating layer 500A on the front major surface 304A of the semiconductor substrate 304 and on sidewalls 304C of the semiconductor substrate by, for example, electroless plating.

The gold layer may also be formed such that a first portion of the gold layer 310 located between the solder mask pixel separation regions 410A on the rear major surface 500B of the substrate forms the anode pixels 400, a second portion of the gold layer 310 located over the first passivating layer 500A on the front major surface of the semiconductor substrate forms the cathode electrode 200, a third portion of the gold layer 310 located over the portion of the second passivating layer 500B forms the steering grid and/or guard ring 405, and no gold remains on the sidewalls of the semiconductor substrate as shown in FIG. 4K. For example, after the gold layer 310 is formed on the substrate as described above, a final polishing step may be utilized to remove the gold from the sidewalls 304C of the semiconductor 304. Thus, in this embodiment, the anode pixels are formed on unpassivated portions of the rear side of the substrate 304 while the guard ring and/or steering grid is formed on passivated portion of the rear side of the substrate.

Subsequently, additional solder mask material 410B can be formed on the sidewalls 304C of the substrate 304 after the steps of forming the anode pixels 400, grid and/or guard ring 405, and cathode electrode 200 as shown in FIG. 4L.

FIGS. 5A-5K (IM3—Claim 25)

FIGS. 5A-5K are schematic cross-sectional views of a method of making a detector at various stages of formation according to another embodiment. In FIG. 5A, a semiconductor substrate 304 comprising front 304A and rear 304B major opposing surfaces is provided. At FIG. 5E, a solder mask layer 410 is formed over the rear major surface 304B. The solder mask layer 410 is then patterned into a plurality of pixel separation regions 410A as shown in FIGS. 5F-5G. After the step of patterning the solder mask layer 410, the method further comprises forming anode pixels 400 over the rear major surface as shown in FIGS. 5J-5L. Additionally, in this embodiment, each anode pixel 400 is formed between adjacent pixel separation regions 410A. A cathode electrode 200 is located over the front major surface 304A of the substrate 304 as shown in FIG. 5K.

The step of patterning the solder mask 410 into a plurality of pixel separation regions can comprise exposing the solder mask layer 410 to radiation, for example, UV radiation, through a mask 204, as shown in FIG. 5F. Subsequently, unexposed regions of the solder mask layer 410 can be removed, as shown in FIG. 5G.

The steps of forming a plurality of anode pixels 400 and cathode electrode 200 may comprise the steps illustrated in FIGS. 5B-5C, and 5J-5K. For example, as illustrated in FIGS. 5B-5C, a first gold layer 310 may be formed on the rear 304B and front 304A major surfaces and on sidewalls 304C of the semiconductor substrate 304 by, for example, electroless plating. Subsequently, the first gold layer may be removed by, for example, a polishing process, such that the first gold layer remains located only on the front major surface 304A of the semiconductor substrate to form the cathode electrode 200, as shown in FIG. 5C. This embodiment may further comprise the steps of forming a positive photoresist pattern over the solder mask pixel separation regions 410A. A negative resist may be used instead. For example, a positive photoresist pattern may be formed by forming a positive photoresist layer 202, as shown in FIG. 5H, exposing portions of the positive photoresist layer through a mask 306, as shown in FIG. 5I, and removing the exposed portions of the photoresist as shown in FIG. 5J. The step of forming a plurality of anode pixels 400 may begin with forming a second gold layer 310' by physical vapor deposition (PVD) such as sputtering over the positive photoresist pattern and on exposed portions of the rear major surface 304B of the substrate as shown in FIG. 5J, followed by lifting off the positive photoresist pattern to form the anode pixels 400, as shown in FIG. 5K.

In this embodiment, solder mask material 410B may also be formed on sidewalls 304C of the substrate, as shown in FIG. 5D, prior to or during the same step as the step of forming solder mask layer 410 in FIG. 5E.

FIG. 6A-6G (IM5—Claim 26)

FIGS. 6A-6G are schematic cross-sectional views of a method of making a detector at various stages of formation according to another embodiment. In FIG. 6A, a semiconductor substrate 304 comprising front 304A and rear 304B major opposing surfaces is provided. At FIG. 6B, a solder mask layer 410 is formed over the rear major surface 304B. The solder mask layer 410 is then patterned into a plurality of pixel separation regions 410A as shown in FIGS. 6C-6D. After the step of patterning the solder mask layer 410, the method further comprises forming anode pixels 400 over the rear major surface as shown in FIGS. 6E-6F. Additionally, in this embodiment, each anode pixel 400 is formed between adjacent pixel separation regions 410A and a cathode electrode 200 is located over the front major surface 304A of the substrate 304 as shown in FIG. 6G.

The step of patterning the solder mask into a plurality of pixel separation regions can comprise exposing the solder mask layer 410 to radiation, for example, UV radiation, through a mask 204 as shown in FIG. 6C. Subsequently, unexposed regions of the solder mask layer 410 can be removed as shown in FIG. 6D.

The cathode electrode 200 may be formed by forming a first gold layer on the rear 304B and front 304A major surfaces, and on sidewalls 304C of the semiconductor substrate 304 by, for example, electroless plating. Subsequently, the first gold layer may be removed by, for example, a polishing process, such that the first gold layer remains located only on the front major surface 304A of the semiconductor substrate, resulting in the illustration of FIG. 6A.

Forming the anode pixels 400 may comprise the steps illustrated in FIGS. 6E-6G. For example, a second gold layer 310' may be formed on exposed portions of the rear major surface 304B between the solder mask pixel separation regions 410A and on the solder mask pixel separation regions by, for example, PVD. Subsequently, the second gold layer may be polished such that a portion of the gold layer located between the solder mask pixel separation regions 410A on the rear major surface of the substrate forms the anode pixels 400, and no gold remains on the sidewalls 304C of the semiconductor substrate. Additional solder mask material 410B may be formed on the sidewalls 304C of the substrate, as shown in FIG. 6G, after the steps of forming the anode pixels 400 and cathode electrode 200.

FIGS. 7A-7G (Claim 27=IM7—Etching and Passivation and IM11—NaOCl Polishing)

Figure 7A:
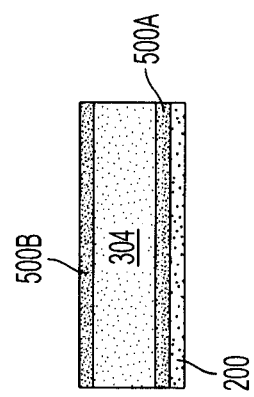
FIGS. 7A-7G are schematic side cross-sectional views of a method of making a detector at various stages of formation according to another embodiment.
Figure 7B:
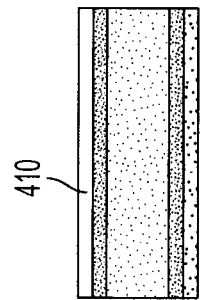
Figure 7C:
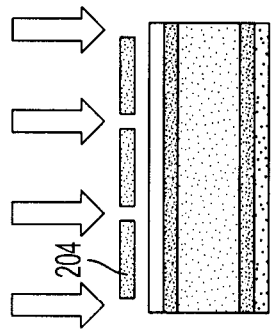
Figure 7D:
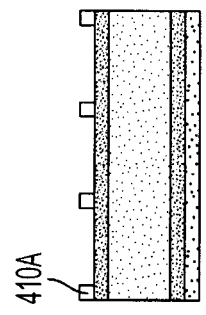
Figure 7E:
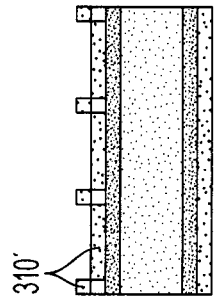
Figure 7F:
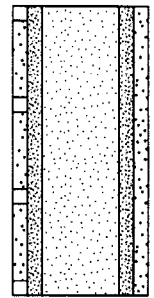
Figure 7G:
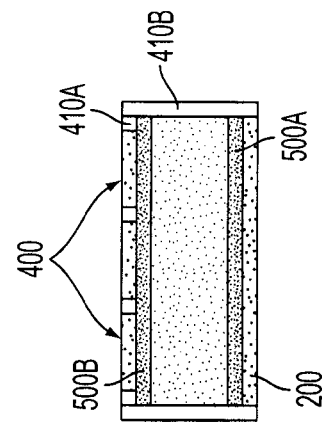

FIGS. 7A-7G are schematic cross-sectional views of a method of making a detector at various stages of formation according to another embodiment. In FIG. 7A, a semiconductor substrate 304 comprising front 304A and rear 304B major opposing surfaces is provided. At FIG. 7B, a solder mask layer 410 is formed over the rear major surface 304B. The solder mask layer 410 is then patterned into a plurality of pixel separation regions 410A as shown in FIGS. 7C-7D. After the step of patterning the solder mask layer 410, the method further comprises forming anode pixels 400 over the rear major surface as shown in FIGS. 7E-7G. Additionally, in this embodiment, each anode pixel 400 is formed between adjacent pixel separation regions 410A. A cathode electrode 200 is located over the front major surface 304A of the substrate 304 as shown in FIG. 7G.

The step of patterning the solder mask into a plurality of pixel separation regions can comprise exposing the solder mask layer 410 to radiation, for example, UV radiation, through a mask 204 as shown in FIG. 7C. Subsequently, unexposed regions of the solder mask layer 410 can be removed as shown in FIG. 7D.

In this embodiment, first 500A and second 500B passivating layers are formed on the front (not visible) and rear (also not visible) major surfaces of the semiconductor substrate 304 prior to forming the solder mask layer 410 by etching and passivation, or by polishing using a NaOCl containing polishing medium. Additionally, the cathode electrode 200 may be formed by forming a first gold layer on the rear 304B and front 304A major surfaces, and on sidewalls 304C of the semiconductor substrate 304 by, for example, electroless plating. Subsequently, the first gold layer may be removed by, for example, a polishing process such that the first gold layer remains located only on the front major surface 304A of the semiconductor substrate, resulting in the configuration of FIG. 7A.

Forming the anode pixels 400 may comprise the steps illustrated in FIGS. 7E-7G. For example, a second gold layer 310' may be formed on the second passivating layer 500B, between the solder mask pixel separation regions 410A and on the solder mask pixel separation regions 410A by, for example, physical vapor deposition (PVD) such as sputtering. Subsequently, the second gold layer may be polished such that a portion of the gold layer located between the solder mask pixel separation regions 410A on the second passivating layer 500B on the rear major surface of the substrate forms the anode pixels 400, and no gold remains on the sidewalls 304C of the semiconductor substrate. Additional solder mask material 410B may be formed on the sidewalls 304C of the substrate, as shown in FIG. 7G after the steps of forming the anode pixels 400 and cathode electrode 200.

FIGS. 8A-8F (IM8—NaOCl Polishing Only—Claim 28)

FIGS. 8A-8F are schematic cross-sectional views of a method of making a detector at various stages of formation according to another embodiment. In FIG. 8A, a semiconductor substrate 304 comprising front 304A and rear 304B major opposing surfaces is provided. At FIG. 8B, a solder mask layer 410 is formed over the rear major surface 304B. The solder mask layer 410 is then patterned into a plurality of pixel separation regions 410A as shown in FIGS. 8C-8D. After the step of patterning the solder mask layer 410, the method further comprises forming anode pixels 400 over the rear major surface as shown in FIGS. 8E-8F. Additionally, in this embodiment, each anode pixel 400 is formed between adjacent pixel separation regions 410A. A cathode electrode 200 is located over the front major surface 304A of the substrate 304 as shown in FIG. 8F.

The step of patterning the solder mask into a plurality of pixel separation regions can comprise exposing the solder mask layer 410 to radiation, for example, UV radiation, through a mask 204 as shown in FIG. 8C. Subsequently, unexposed regions of the solder mask layer 410 can be removed as shown in FIG. 8D.

In this embodiment, first 500A and second 500B passivating layers are formed on the front and rear major surfaces of the semiconductor substrate 304 by NaOCl polishing prior to forming the solder mask layer 410. Additionally, a gold layer may be formed on the first passivating layer 500A on the front major surface 305A of the semiconductor substrate by, for example, an electroless deposition process, prior to forming the solder mask layer, thereby arriving at the structure of FIG. 8A.

The step of forming the anode pixels 400 may comprise the steps illustrated in FIGS. 8E-8F. For example, a second gold layer 310' may be formed on exposed portions of the second passivating layer 500B on the rear major surface between the solder mask pixel separation regions 410A by, for example, electroless plating. Additional solder mask material 410B may be formed on the sidewalls 304C of the substrate, as shown in FIG. 8F, after the steps of forming the anode pixels 400 and cathode electrode 200.

FIGS. 9A-9I (Claim 29=IM10—Polish Only with NaOCl; IM11—Polish+Etch+Passivate with NaOCl)

FIGS. 9A-9I are schematic cross-sectional views of a method of making a detector at various stages of formation according to another embodiment. In FIG. 9A, a semiconductor substrate 304 comprising front 304A and rear 304B major opposing surfaces is provided. At FIG. 9B, a solder mask layer 410 is formed over the rear major surface 304B. The solder mask layer 410 is then patterned into a plurality of pixel separation regions 410A as shown in FIGS. 9C-9D. After the step of patterning the solder mask layer 410, the method further comprises forming anode pixels 400 over the rear major surface as shown in FIGS. 9G-9I. Additionally, in this embodiment, each anode pixel 400 is formed between adjacent pixel separation regions 410A. A cathode electrode 200 is located over the front major surface 304A of the substrate 304 as shown in FIG. 9I.

The step of patterning the solder mask 410 into a plurality of pixel separation regions can comprise exposing the solder mask layer 410 to radiation, for example, UV radiation, through a mask 204 as shown in FIG. 9C. Subsequently, unexposed regions of the solder mask layer 410 can be removed as shown in FIG. 9D.

In this embodiment, first 500A and second 500B passivating layers are formed on the front and rear major surfaces of the semiconductor substrate 304 by NaOCl polishing prior to forming the solder mask layer 410. A chemical etching step may be used to remove sub-surface damage on the substrate resulting from lapping and polishing. Additionally, a gold layer may be formed on the first passivating layer 500A on the front major surface 304A of the semiconductor substrate by, for example, an electroless deposition process, prior to forming the solder mask layer, thereby arriving at the structure of FIG. 9A.

This embodiment may further comprise the steps of forming a positive photoresist pattern over the solder mask pixel separation regions 410A, as shown in FIGS. 9E-9G. For example, a positive photoresist pattern may be formed by forming a positive photoresist layer 202, as shown in FIG. 9E, over the pixel separation regions 410, exposing portions of the positive photoresist layer through a mask 306, as shown in FIG. 9F, and removing the exposed portions of the photoresist as shown in FIG. 9G. The step of forming a plurality of anode pixels 400 may begin with forming a second gold layer 310' by physical vapor deposition (PVD) such as sputtering over the positive photoresist pattern and on exposed passivated portions of the rear major surface 304B of the substrate as shown in FIG. 9G, followed by lifting off the positive photoresist pattern to form the anode pixels 400 as shown in FIG. 9H. Subsequently, additional solder mask material 410B can be formed on the sidewalls 304C of the substrate 304 after the steps of forming the anode pixels 400, (and optionally grid and/or guard ring) and cathode electrode 200 as shown in FIG. 9I. In this embodiment, the anode pixels 400 are formed on the passivating layer 500 on the substrate.

FIGS. 10A-10J (Claim30=IM12)

FIGS. 10A-10J are schematic cross-sectional views of a method of making a detector at various stages of formation according to another embodiment. In FIG. 10A, a semiconductor substrate 304 comprising front 304A and rear 304B major opposing surfaces is provided. At FIG. 10E, a solder mask layer 410 is formed over the rear major surface 304B. The solder mask layer 410 is then patterned into a plurality of pixel separation regions 410A as shown in FIGS. 10E-10G. After the step of patterning the solder mask layer 410, the method further comprises forming anode pixels 400 over the rear major surface as shown in FIGS. 10H-10J. Additionally, in this embodiment, each anode pixel 400 is formed between adjacent pixel separation regions 410A. A cathode electrode 200 is located over the front major surface 304A of the substrate 304 as shown in FIG. 10J.

The step of patterning the solder mask 410 into a plurality of pixel separation regions can comprise exposing the solder mask layer 410 to radiation, for example, UV radiation, through a mask 204 as shown in FIG. 10F. Subsequently, unexposed regions of the solder mask layer 410 can be removed as shown in FIG. 10G.

The steps of forming a plurality of anode pixels 400 and cathode electrode 200 may comprise the steps illustrated in FIGS. 10H-10J, and FIGS. 10B-10C, respectively. For example, as illustrated in FIG. 10B, a first gold layer 310 may be formed on the rear 304B and front 304A major surfaces and on sidewalls 304C of the semiconductor substrate 304 by, for example, electroless plating. Subsequently, the first gold layer may be removed by, for example, a polishing process, such that the first gold layer remains located only on the front major surface 304A of the semiconductor substrate to form the cathode electrode 200, as shown in FIG. 10C. Additionally, a passivating layer 500B can be formed on the rear major surface 304B of the semiconductor substrate 304 prior to forming the solder mask layer as shown in FIG. 10D. Upon patterning the solder mask layer 410 into pixel separation regions 410A, a second gold layer 310' may be formed on exposed portions of the passivating layer 500B on the rear major surface between the solder mask pixel separation regions 410, and on sidewalls 304C of the semiconductor substrate by electroless plating, as shown in FIG. 10H. Subsequently, the second gold layer may be polished such that a portion of the gold layer located between the solder mask pixel separation regions 410A on the passivating layer 500B on the rear major surface of the substrate forms the anode pixels 400, and no gold remains on the sidewalls 304C of the semiconductor substrate, as shown in FIG. 10I. Additional solder mask material 410B may be formed on the sidewalls 304C of the substrate, as shown in FIG. 10J, after the steps of forming the anode pixels 400. In this embodiment, only the anode pixels 400, but not the cathode electrode 200, are formed on a passivating layer 500B.

FIGS. 11A-11I (Claim31=IM "13"—IM1 with Indium Cathode)

FIGS. 11A-11I are schematic cross-sectional views of a method of making a detector at various stages of formation according to another embodiment. In FIG. 11A, a semiconductor substrate 304 comprising front 304A and rear 304B major opposing surfaces is provided. At FIG. 11D, a solder mask layer 410 is formed over the rear major surface 304B. The solder mask layer 410 is then patterned into a plurality of pixel separation regions 410A as shown in FIGS. 11E-11F. After the step of patterning the solder mask layer 410, the method further comprises forming anode pixels 400 over the rear major surface as shown in FIGS. 11G-11H. Additionally, in this embodiment, each anode pixel 400 is formed between adjacent pixel separation regions 410A. A cathode electrode 200 is located over the front major surface 304A of the substrate 304 as shown in FIG. 11I.

The step of patterning the solder mask 410 into a plurality of pixel separation regions can comprise exposing the solder mask layer 410 to radiation, for example, UV radiation, through a mask 204 as shown in FIG. 11E. Subsequently, unexposed regions of the solder mask layer 410 can be removed as shown in FIG. 11F.

The steps of forming a plurality of anode pixels 400 and cathode electrode 200 may comprise the steps illustrated in FIGS. 11H-11J, and FIGS. 11B-11C, respectively. For example, as illustrated in FIG. 11B, an indium layer 310 may be formed on the rear 304B and front 304A major surfaces and on sidewalls 304C of the semiconductor substrate 304 by, for example, electroless plating. The electroless indium deposition may be performed by immersing the whole detector in an indium containing solution with the cathode face up such that an indium layer 310 may be formed on the rear 304B and front 304A major surfaces and on sidewalls 304C of the semiconductor substrate 304 as shown in FIG. 11B. If desired, the indium layer may be annealed while the cathode is face up and protected. Subsequently, the indium layer may be removed by, for example, a polishing process, such that the indium layer remains located only on the front major surface 304A of the semiconductor substrate to form the cathode electrode 200, as shown in FIG. 11C. Alternatively, the indium layer, may be formed only on the front surface 304A by PVD, such as sputtering.

Upon patterning solder mask layer 410 into pixel separation regions 410A, a gold layer 310' may be formed on exposed portions of rear major surface between the solder mask pixel separation regions 410, and on sidewalls 304C of the semiconductor substrate by electroless plating as shown in FIG. 11G. Subsequently, the second gold layer may be polished such that a portion of the gold layer located between the solder mask pixel separation regions 410A on the on the rear major surface 304B of the substrate forms the anode pixels 400, and no gold remains on the sidewalls 304C of the semiconductor substrate as shown in FIG. 11H. Additional solder mask material 410B may be formed on the sidewalls 304C of the substrate, as shown in FIG. 11I, after the steps of forming the anode pixels 400.

The methods described in the above embodiments, such as the embodiment illustrated in FIGS. 11A-11I for example, may also include the following optional steps. First, semiconductor substrate tile 304 may be polished prior to depositing any layers thereon. Second, the solder mask layer 410 patterning may include developing unexposed solder mask regions in any suitable developer, such as sodium carbonate. The solder mask may then be hard cured forming the pixel separation regions 410A as shown FIG. 11F for example. Third, cleaning and baking steps known to those skilled in the semiconductor device manufacturing art have been omitted from the figures for simplicity.

In the above described embodiments, a radiation detector comprises a semiconductor substrate having opposing front and rear surfaces, a cathode electrode located over the front surface of said semiconductor substrate, a solder mask formed as a plurality of pixel separation regions and a plurality of anode pixels located over the rear surface of said semiconductor substrate. In the radiation detector, adjacent anode pixels are separated by a respective pixel separation region and the solder mask of the pixel separation regions does not extend over the anode pixels. The solder mask acts as a negative photo resist. Additionally, the solder mask remains on the device after the device is connected to an external circuit (not shown), for example as shown and disclosed in co-pending U.S. patent application Ser. No. 11/642,819 which is hereby incorporated by reference in its entirety herein.

In some embodiments, the radiation detector further comprises a solder mask formed on sidewalls of the semiconductor substrate.

In the above described embodiments of the radiation detector, a top surface of each of the anode pixels is coplanar with a top surface of the solder mask formed as a plurality of pixel separation regions. It is also noted that in the above embodiments, a passivation layer may be formed under a guard ring and/or steering grid only, but not under anode pixels formed under the guard ring and/or steering grid.

Where some embodiments have included an etching step, a bromine based etchant may be utilized to remove sub-surface damage, for example, from lapping and polishing.

Although the foregoing refers to particular preferred embodiments, it will be understood that the present invention is not so limited. It will occur to those of ordinary skill in the art that various modifications may be made to the disclosed embodiments and that such modifications are intended to be within the scope of the present invention. All of the publications, patent applications and patents cited herein are incorporated herein by reference in their entirety.

What is claimed is:

1. A method of making a semiconductor radiation detector, comprising:
providing a semiconductor substrate comprising front and rear major opposing surfaces;
forming a solder mask layer over the rear major surface;
patterning the solder mask layer into a plurality of pixel separation regions;
after the step of patterning the solder mask layer, forming anode pixels over the rear major surface, wherein each anode pixel is formed between adjacent pixel separation regions;
wherein a cathode electrode is located over the front major surface of the substrate; and
wherein both the front and rear major surfaces of the semiconductor substrate are passivated prior to forming the solder mask layer.

2. A method of making a semiconductor radiation detector, comprising:
providing a semiconductor substrate comprising front and rear major opposing surfaces;
forming a solder mask layer over the rear major surface;
patterning the solder mask layer into a plurality of pixel separation regions;
after the step of patterning the solder mask layer, forming anode pixels over the rear major surface, wherein each anode pixel is formed between adjacent pixel separation regions;
wherein a cathode electrode is located over the front major surface of the substrate; and
wherein the substrate is provided with passivated front and rear major opposing surfaces, and the cathode electrode is formed on the front passivated surface.

3. A method of making a semiconductor radiation detector, comprising:
providing a semiconductor substrate comprising front and rear major opposing surfaces;
forming a solder mask layer over the rear major surface;
patterning the solder mask layer into a plurality of pixel separation regions;
after the step of patterning the solder mask layer, forming anode pixels over the rear major surface, wherein each anode pixel is formed between adjacent pixel separation regions;
wherein a cathode electrode is located over the front major surface of the substrate; and
forming solder mask between the substrate and at least one of a guard ring and steering grid; or forming solder mask over at least one of the guard ring and steering grid; or forming solder mask between the substrate and at least one of the guard ring and steering grid, and over at least one of the guard ring and steering grid.

4. The method of claim 3, further comprising forming solder mask over a portion of each of the anode pixels.

5. A method of making a semiconductor radiation detector, comprising:
providing a semiconductor substrate comprising front and rear major opposing surfaces;
forming a solder mask layer over the rear major surface;
patterning the solder mask layer into a plurality of pixel separation regions;

after the step of patterning the solder mask layer, forming anode pixels over the rear major surface, wherein each anode pixel is formed between adjacent pixel separation regions;
wherein a cathode electrode is located over the front major surface of the substrate;
passivating at least the rear major surface of the semiconductor substrate prior to forming the solder mask layer;
etching the passivated portions of the rear surface of the substrate between solder mask pixel separation regions prior to the step of forming the anode pixels; and
forming the anode pixels directly on exposed portions of the rear major surface.

6. A method of making a semiconductor radiation detector, comprising:
providing a semiconductor substrate comprising front and rear major opposing surfaces;
forming a solder mask layer over the rear major surface;
patterning the solder mask layer into a plurality of pixel separation regions;
after the step of patterning the solder mask layer, forming anode pixels over the rear major surface, wherein each anode pixel is formed between adjacent pixel separation regions;
wherein a cathode electrode is located over the front major surface of the substrate;
wherein the step of patterning the solder mask layer into a plurality of pixel separation regions comprises exposing the solder mask layer to radiation through a mask and removing unexposed regions of the solder mask layer;
forming a gold layer on exposed portions of the rear major surface between the solder mask pixel separation regions, on the front major surface and on sidewalls of the semiconductor substrate by electroless plating;
polishing the gold layer such that a first portion of the gold layer located between the solder mask pixel separation regions on the rear major surface of the substrate forms the anode pixels, a second portion of the gold layer located on the front major surface of the semiconductor substrate forms the cathode electrode, and no gold remains on the sidewalls of the semiconductor substrate; and
forming additional solder mask material on the sidewalls of the substrate after the steps of forming the anode pixels and cathode electrode.

7. A method of making a semiconductor radiation detector, comprising:
providing a semiconductor substrate comprising front and rear major opposing surfaces;
forming a solder mask layer over the rear major surface;
patterning the solder mask layer into a plurality of pixel separation regions;
after the step of patterning the solder mask layer, forming anode pixels over the rear major surface, wherein each anode pixel is formed between adjacent pixel separation regions;
wherein a cathode electrode is located over the front major surface of the substrate;
wherein the step of patterning the solder mask layer into a plurality of pixel separation regions comprises exposing the solder mask layer to radiation through a mask and removing unexposed regions of the solder mask layer;
forming first and second passivating layers on the front and rear major surfaces of the semiconductor substrate prior to forming the solder mask layer;
forming a gold layer on exposed portions of the second passivating layer on the rear major surface between the solder mask pixel separation regions, on the first passivating layer on the front major surface and on sidewalls of the semiconductor substrate by electroless plating;
polishing the gold layer such that a first portion of the gold layer located between the solder mask pixel separation regions on the second passivating layer on the rear major surface of the substrate forms the anode pixels, a second portion of the gold layer located on the first passivating layer on the front major surface of the semiconductor substrate forms the cathode electrode, and no gold remains on the sidewalls of the semiconductor substrate; and
forming additional solder mask material on the sidewalls of the substrate after the steps of forming the anode pixels and cathode electrode.

8. A method of making a semiconductor radiation detector, comprising:
providing a semiconductor substrate comprising front and rear major opposing surfaces;
forming a solder mask layer over the rear major surface;
patterning the solder mask layer into a plurality of pixel separation regions;
after the step of patterning the solder mask layer, forming anode pixels over the rear major surface, wherein each anode pixel is formed between adjacent pixel separation regions;
wherein a cathode electrode is located over the front major surface of the substrate;
wherein the step of patterning the solder mask layer into a plurality of pixel separation regions comprises exposing the solder mask layer to radiation through a mask and removing unexposed regions of the solder mask layer;
forming first and second passivating layers on the front and rear major surfaces of the semiconductor substrate prior to forming the solder mask layer;
etching exposed portions of the second passivating layer located between the solder mask pixel separation regions to expose portions of the rear major surface of the substrate;
forming a gold layer on the exposed portions of the rear major surface between the solder mask pixel separation regions, over the first passivating layer on the front major surface and on sidewalls of the semiconductor substrate by electroless plating;
polishing the gold layer such that a first portion of the gold layer located between the solder mask pixel separation regions on the exposed portions of the rear major surface of the substrate forms the anode pixels, a second portion of the gold layer located over the first passivating layer on the front major surface of the semiconductor substrate forms the cathode electrode, and no gold remains on the sidewalls of the semiconductor substrate; and
forming additional solder mask material on the sidewalls of the substrate after the steps of forming the anode pixels and cathode electrode.

9. A method of making a semiconductor radiation detector, comprising:
providing a semiconductor substrate comprising front and rear major opposing surfaces;
forming a solder mask layer over the rear major surface;
patterning the solder mask layer into a plurality of pixel separation regions;
after the step of patterning the solder mask layer, forming anodepixels over the rear major surface, wherein each anode pixel is formed between adjacent pixel separation regions;

wherein a cathode electrode is located over the front major surface of the substrate;

wherein the step of patterning the solder mask layer into a plurality of pixel separation regions comprises exposing the solder mask layer to radiation through a mask and removing unexposed regions of the solder mask layer;

forming first and second passivating layers on the front and rear major surfaces of the semiconductor substrate prior to forming the solder mask layer;

forming a positive photoresist over the solder mask pixel separation regions and over exposed portions of the second passivating layer;

patterning the positive photoresist to expose the second passivating layer and the solder mask pixel separation regions such that grid and guard ring regions are covered by patterned positive photoresist;

etching exposed portions of the second passivating layer located between the solder mask pixel separation regions which are not covered by the patterned positive photoresist to expose the rear major surface of the substrate;

removing the patterned positive photoresist;

forming a gold layer on the rear major surface of the semiconductor substrate between the solder mask pixel separation regions, on a portion of the second passivating layer in the grid and guard ring region that was previously covered by the patterned positive photoresist, on the first passivating layer on the front major surface of the semiconductor substrate and on sidewalls of the semiconductor substrate by electroless plating;

polishing the gold layer such that a first portion of the gold layer located between the solder mask pixel separation regions on the rear major surface of the substrate forms the anode pixels, a second portion of the gold layer located over the first passivating layer on the front major surface of the semiconductor substrate forms the cathode electrode, a third portion of the gold layer located over the portion of the second passivating layer forms the grid and guard ring, and no gold remains on the sidewalls of the semiconductor substrate; and forming additional solder mask material on the sidewalls of the substrate after the steps of forming the anode pixels and cathode electrode.

10. A method of making a semiconductor radiation detector, comprising:

providing a semiconductor substrate comprising front and rear major opposing surfaces;

forming a solder mask layer over the rear major surface;

patterning the solder mask layer into a plurality of pixel separation regions;

after the step of patterning the solder mask layer, forming anode pixels over the rear major surface, wherein each anode pixel is formed between adjacent pixel separation regions;

wherein a cathode electrode is located over the front major surface of the substrate;

wherein the step of patterning the solder mask layer into a plurality of pixel separation regions comprises exposing the solder mask layer to radiation through a mask and removing unexposed regions of the solder mask layer;

forming a first gold layer on the rear and front major surfaces and on sidewalls of the semiconductor substrate by electroless plating;

polishing the first gold layer such that the first gold layer remains located only on the front major surface of the semiconductor substrate to form the cathode electrode;

forming a positive photoresist pattern over the solder mask pixel separation regions;

forming a second gold layer by PVD over the positive photoresist pattern and on exposed portions of the rear major surface of the substrate; and lifting off the positive photoresist pattern to form the anode pixels.

11. A method of making a semiconductor radiation detector, comprising:

providing a semiconductor substrate comprising front and rear major opposing surfaces;

forming a solder mask layer over the rear major surface;

patterning the solder mask layer into a plurality of pixel separation regions;

after the step of patterning the solder mask layer, forming anode pixels over the rear major surface, wherein each anode pixel is formed between adjacent pixel separation regions;

wherein a cathode electrode is located over the front major surface of the substrate;

wherein the step of patterning the solder mask layer into a plurality of pixel separation regions comprises exposing the solder mask layer to radiation through a mask and removing unexposed regions of the solder mask layer;

forming a first gold layer on the rear and front major surfaces and on sidewalls of the semiconductor substrate by electroless plating;

polishing the gold layer such that the gold layer remains located only on the front major surface of the semiconductor substrate to form the cathode electrode;

forming a second gold layer on exposed portions of the rear major surface between the solder mask pixel separation regions and on the solder mask pixel separation regions by PVD;

polishing the second gold layer such that a portion of the gold layer located between the solder mask pixel separation regions on the rear major surface of the substrate forms the anode pixels, and no gold remains on the sidewalls of the semiconductor substrate; and forming additional solder mask material on the sidewalls of the substrate after the steps of forming the anode pixels and cathode electrode.

12. A method of making a semiconductor radiation detector, comprising:

providing a semiconductor substrate comprising front and rear major opposing surfaces;

forming a solder mask layer over the rear major surface;

patterning the solder mask layer into a plurality of pixel separation regions;

after the step of patterning the solder mask layer, forming anode pixels over the rear major surface, wherein each anode pixel is formed between adjacent pixel separation regions;

wherein a cathode electrode is located over the front major surface of the substrate;

wherein the step of patterning the solder mask layer into a plurality of pixel separation regions comprises exposing the solder mask layer to radiation through a mask and removing unexposed regions of the solder mask layer;

forming first and second passivating layers on the front and rear major surfaces of the semiconductor substrate prior to forming the solder mask layer by etching and passivation or by NaOCl polishing;

forming a gold cathode on the first passivating layer;

forming a gold layer on exposed portions of the second passivating layer on the rear major surface between the solder mask pixel separation regions and on the solder mask pixel separation regions by PVD;

polishing the gold layer such that a first portion of the gold layer located between the solder mask pixel separation regions on the second passivating layer over the rear major surface of the substrate forms the anode pixels, and no gold remains on the sidewalls of the semiconductor substrate; and forming additional solder mask material on the sidewalls of the substrate after the steps of forming the anode pixels and cathode electrode.

13. A method of making a semiconductor radiation detector, comprising:

providing a semiconductor substrate comprising front and rear major opposing surfaces;

forming a solder mask layer over the rear major surface;

patterning the solder mask layer into a plurality of pixel separation regions;

after the step of patterning the solder mask layer, forming anode pixels over the rear major surface, wherein each anode pixel is formed between adjacent pixel separation regions;

wherein a cathode electrode is located over the front major surface of the substrate;

wherein the step of patterning the solder mask layer into a plurality of pixel separation regions comprises exposing the solder mask layer to radiation through a mask and removing unexposed regions of the solder mask layer;

forming first and second passivating layers on the front and rear major surfaces of the semiconductor substrate by NaOCl polishing prior to forming the solder mask layer;

forming a gold layer on the first passivating layer on the front major surface of the semiconductor substrate to form the cathode electrode prior to forming the solder mask layer;

forming a gold layer over exposed portions of the second passivating layer on the rear major surface between the solder mask pixel separation regions by electroless plating to form the anode pixels; and forming additional solder mask material on the sidewalls of the substrate after the steps of forming the anode pixels and cathode electrode.

14. A method of making a semiconductor radiation detector, comprising:

providing a semiconductor substrate comprising front and rear major opposing surfaces;

forming a solder mask layer over the rear major surface;

patterning the solder mask layer into a plurality of pixel separation regions;

after the step of patterning the solder mask layer, forming anode pixels over the rear major surface, wherein each anode pixel is formed between adjacent pixel separation regions;

wherein a cathode electrode is located over the front major surface of the substrate;

wherein the step of patterning the solder mask layer into a plurality of pixel separation regions comprises exposing the solder mask layer to radiation through a mask and removing unexposed regions of the solder mask layer;

forming first and second passivating layers on the front and rear major surfaces of the semiconductor substrate by NaOCl polishing prior to forming the solder mask layer;

forming a gold layer on the first passivating layer on the front major surface of the semiconductor substrate to form the cathode electrode prior to forming the solder mask layer;

forming a positive photoresist pattern over the solder mask pixel separation regions;

forming a gold layer by PVD over the positive photoresist pattern and on exposed portions of the second passivating layer on the rear major surface of the substrate; and lifting off the positive photoresist pattern to form the anode pixels on the exposed portions of the second passivating layer.

15. A method of making a semiconductor radiation detector, comprising:

providing a semiconductor substrate comprising front and rear major opposing surfaces;

forming a solder mask layer over the rear major surface;

patterning the solder mask layer into a plurality of pixel separation regions;

after the step of patterning the solder mask layer, forming anode pixels over the rear major surface, wherein each anode pixel is formed between adjacent pixel separation regions;

wherein a cathode electrode is located over the front major surface of the substrate;

wherein the step of patterning the solder mask layer into a plurality of pixel separation regions comprises exposing the solder mask layer to radiation through a mask and removing unexposed regions of the solder mask layer;

forming a gold layer on the rear and front major surfaces and on sidewalls of the semiconductor substrate by electroless plating;

polishing the gold layer such that the gold layer remains located only on the front major surface of the semiconductor substrate to form the cathode electrode;

forming a passivating layer on the rear major surface of the semiconductor substrate prior to forming the solder mask layer;

forming a gold layer on exposed portions of the passivating layer on the rear major surface between the solder mask pixel separation regions, on the front major surface and on sidewalls of the semiconductor substrate by electroless plating;

polishing the gold layer such that a first portion of the gold layer located between the solder mask pixel separation regions on the passivating layer on the rear major surface of the substrate forms the anode pixels and no gold remains on the sidewalls of the semiconductor substrate; and forming additional solder mask material on the sidewalls of the substrate after the steps of forming the anode pixels and cathode electrode.

16. A method of making a semiconductor radiation detector, comprising:

providing a semiconductor substrate comprising front and rear major opposing surfaces;

forming a solder mask layer over the rear major surface;

patterning the solder mask layer into a plurality of pixel separation regions;

after the step of patterning the solder mask layer, forming anode pixels over the rear major surface, wherein each anode pixel is formed between adjacent pixel separation regions;

wherein a cathode electrode is located over the front major surface of the substrate;

wherein the step of patterning the solder mask layer into a plurality of pixel separation regions comprises exposing the solder mask layer to radiation through a mask and removing unexposed regions of the solder mask layer;

forming an indium layer on the rear and front major surfaces and on sidewalls of the semiconductor substrate by electroless plating;

polishing the indium layer such that the indium layer remains located only on the front major surface of the semiconductor substrate to form the cathode electrode;

forming a gold layer on exposed portions of the rear major surface between the solder mask pixel separation regions and on sidewalls of the semiconductor substrate by electroless plating;

polishing the gold layer such that a first portion of the gold layer located between the solder mask pixel separation regions on the rear major surface of the substrate forms the anode pixels, and no gold remains on the sidewalls of the semiconductor substrate; and forming additional solder mask material on the sidewalls of the substrate after the steps of forming the anode pixels and cathode electrode.

* * * * *